(12) United States Patent
Barrow

(10) Patent No.: US 8,754,480 B2
(45) Date of Patent: Jun. 17, 2014

(54) LOW ON-RESISTANCE POWER TRANSISTOR HAVING TRANSISTOR STRIPES

(75) Inventor: Jeffrey G. Barrow, Tuscon, AZ (US)

(73) Assignee: Integrated Device Technology, Inc., San Jose, CA (US)

( * ) Notice: Subject to any disclaimer, the term of this patent is extended or adjusted under 35 U.S.C. 154(b) by 468 days.

(21) Appl. No.: 13/048,726

(22) Filed: Mar. 15, 2011

(65) Prior Publication Data
US 2012/0235241 A1  Sep. 20, 2012

(51) Int. Cl.
*H01L 21/70* (2006.01)

(52) U.S. Cl.
USPC ........................... 257/368; 257/E27.06

(58) Field of Classification Search
USPC .............................. 257/368, E27.06
See application file for complete search history.

(56) References Cited

U.S. PATENT DOCUMENTS

| | | | | |
|---|---|---|---|---|
| 5,583,424 A | * | 12/1996 | Sato et al. | 323/282 |
| 5,877,529 A | * | 3/1999 | So et al. | 257/341 |
| 5,929,468 A | * | 7/1999 | Asano | 257/197 |
| 6,008,518 A | * | 12/1999 | Takahashi | 257/326 |
| 6,365,930 B1 | * | 4/2002 | Schillaci et al. | 257/339 |
| 6,762,479 B2 | * | 7/2004 | Groves et al. | 257/578 |
| 7,592,650 B2 | * | 9/2009 | Hshieh | 257/226 |
| 7,721,232 B2 | * | 5/2010 | Ejury | 716/132 |
| 2006/0113657 A1 | * | 6/2006 | Ejury | 257/691 |
| 2009/0284213 A1 | * | 11/2009 | Ward et al. | 318/801 |

* cited by examiner

*Primary Examiner* — Bilkis Jahan
(74) *Attorney, Agent, or Firm* — Traskbritt P.C.

(57) ABSTRACT

A power transistor and a power converter are disclosed that may improve the on-resistance and corresponding silicon area of a power transistor. The power transistor may comprise a drain, a source, and a channel therebetween divided into a plurality of transistor stripes, the plurality of transistor stripes being grouped in a plurality of different groups. The power transistor may further comprise a first top metal associated with one of the drain and the source, and a second top metal associated with the other of the drain and the source. The second top metal includes at least one portion that is coupled to different groups of transistor stripes. A related method for determining a layout topology of a power transistor is also disclosed.

24 Claims, 12 Drawing Sheets

LOW ON-RESISTANCE POWER TRANSISTOR HAVING TRANSISTOR STRIPES

TECHNICAL FIELD

Embodiments of the present disclosure relate generally to physical layouts of integrated circuits and, more particularly, to apparatuses and methods related to physical layouts of a power transistor, a plurality of power transistors, and various power converters.

BACKGROUND

Power management products for integrated circuits (ICs) such as boost converters, buck converters, low-dropout (LDO) converters, and other power coverters often include one or more power transistors. Such power transistors may consume a relatively large percentage of the total silicon die area of the power converter, and may contribute to relatively high manufacturing costs. Designing the power transistor may also be a complex task, such that design of the power transistor may expend a lot of resources before the design is determined to operate as desired. As a result, making changes to the design of the power transistor may add research and development time and cost, which often causes IC design engineers to over-size the power transistors during the design state in order to compensate for the accumulation of parasitic resistance. Over-sizing the power transistors, however, may unnecessarily increase the manufacturing costs of the die without an associated performance improvement, and in some cases can even result in greater power loss from correspondingly increasing the gate capacitance of the power transistor.

BRIEF SUMMARY

Embodiments of the present invention include a power transistor. The power transistor comprises a drain, a source, and a channel therebetween divided into a plurality of transistor stripes, the plurality of transistor stripes being grouped in a plurality of different groups. The power transistor further comprises a first top metal associated with one of the drain and the source, and a second top metal associated with the other of the drain and the source. The second top metal includes at least one portion that is coupled to different groups of transistor stripes.

Another embodiment of the present invention includes a power converter. The power converter comprises a first power transistor. The first power transistor comprises a drain, a source, and a channel therebetween, wherein the channel is divided into a plurality of channels that contribute to an overall effective channel width of the first power transistor. The power transistor further comprises a first top metal associated with one of the source and the drain, and a second top metal associated with the other of the source and the drain. The second top metal includes at least a first portion that couples with a first group of the plurality of channels from a first direction, and at least a second portion that couples with a second group of the plurality of channels from a second direction.

In yet another embodiment of the present invention, a method for determining a layout topology of a power transistor is disclosed. The method comprises estimating a resistance (R) of a power transistor based at least in part on a calculation from an equation using a first width, the equation comprising:

$$R = ap_c \frac{(e^{2aw}+1)}{(e^{2aw}-1)},$$

wherein $$a = \sqrt{\frac{p_m}{p_c}},$$

$p_m$ is a resistivity of metal layer of the power transistor, $p_c$ is a resistivity of a channel of the power transistor, and w is a width of a plurality of transistor stripes of the power transistor. The method further comprises estimating another resistance of a power transistor based at least in part on a calculation from the equation using a second width of a plurality of transistor stripes of the power transistor, and defining a layout topology of the power transistor using the resistance and the another resistance to determine a quantity and width of transistor stripes for a layout topology of the power transistor responsive to a comparison of the resistance and the another resistance.

DETAILED DESCRIPTION

In the following description, elements, circuits, and functions may be shown in simplified schematic diagram form in order not to obscure the present invention in unnecessary detail. Conversely, specific implementations shown and described are exemplary only and should not be construed as the only way to implement the present invention unless specified otherwise herein. It will be readily apparent to one of ordinary skill in the art that the present invention may be practiced by numerous other configurations and solutions. Furthermore, in this description of embodiments of the invention, reference is made to the accompanying drawings, which form a part hereof, and in which is shown, by way of illustration, specific embodiments in which the invention may be practiced. The embodiments are intended to describe aspects of the invention in sufficient detail to enable those skilled in the art to practice the invention. Other embodiments may be utilized and changes may be made without departing from the scope of the present invention. The following detailed description is not to be taken in a limiting sense, and the scope of the present invention is defined only by the appended claims.

It should be understood that any reference to an element herein using a designation such as "first," "second," and so forth does not limit the quantity or order of those elements, unless such limitation is explicitly stated. Rather, these designations may be used herein as a convenient method of distinguishing between two or more elements or instances of an element. Thus, a reference to first and second elements does not mean that only two elements may be employed there or that the first element must precede the second element in some manner. Also, unless stated otherwise a set, block, or group of elements may comprise one or more elements. In particular, reference to a top metal layer may be a single metal layer, or in some embodiments a plurality of parallel connected metal layers, that couple to the bottom metal and the bond pads associated with the corresponding drain and source. In addition, reference to a bottom metal layer may be include a single metal layer, or in some embodiments a plurality of parallel connected metal layers, that couple to the top metal and the diffusion regions associated with the corresponding drain and source. In other words, reference to "top metal" should not be limited to a single layer of top metal unless specifically stated herein. For example, a "first top metal" may include one or more metal layers functioning as a top metal layer, and a "second top metal" may include one or more metal layers functioning as another top metal layer. Likewise, reference to "bottom metal" should not be limited to a single layer of bottom metal unless specifically stated herein.

Figure 1:
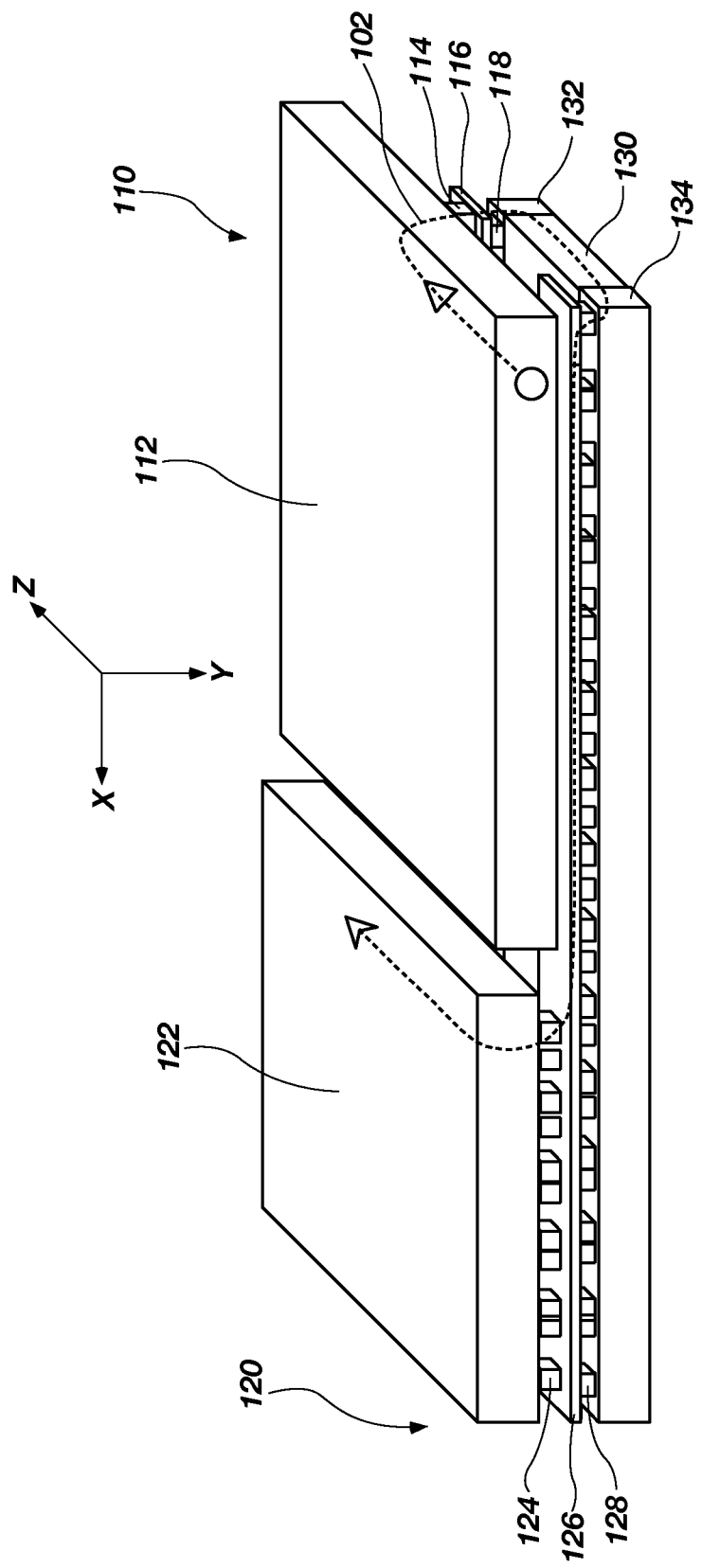
FIG. 1 is a three-dimensional view of a power transistor.

FIG. 1 is a three-dimensional (3D) view of a power transistor 100. The power transistor 100 includes a drain 110, a source 120, and a channel 130 therebetween. The power transistor 100 further includes top drain metal 112, vias 114, bottom drain metal 116, contacts 118, top source metal 122, vias 124, bottom source metal 126, contacts 128, drain diffusion 132, and source diffusion 134.

In operation, current 102 (represented by the dashed path) may flow from the drain 110 to the source 120 through the channel 130. For example, current 102 flows into the top drain metal 112 from a drain terminal contact (not shown). While in the top drain metal 112, the current 102 flows in the "Z" direction upon reaching the vias 114 that electrically couple the top drain metal 112 and the bottom drain metal 116. The current 102 flows from the bottom drain metal 116 to the drain diffusion 132 through contacts 118 therebetween. Thus, once the current 102 reaches the vias 114 the current 102 flows from the top drain metal 112 to the drain diffusion 132 in the "Y" direction without flowing in the "X" direction of the bottom drain metal 116. The current 102 flows from the drain diffusion 132 to the source diffusion 134 in the "Z" direction, and further in the "Y" direction from the source diffusion 134 to the bottom source metal 126 through contacts 128 therebetween.

The current 102 flows in the bottom source metal 126 in the "X" direction to vias 124 electrically coupling the bottom source metal 126 and the top source metal 122. If the current 102 reaches the vias 124, the current 102 flows from the bottom source metal 126 to the top source metal 122 in the "Y" direction. The current 102 flows in the top source metal 122 in the "Z" direction, and out of the top source metal 122 to a source terminal contact (not shown). While the current 102 is shown in FIG. 1 as flowing in a single current path, it is noted that a plurality of contacts 118, 128 and a plurality of vias 114, 124 exist, such the current 102 may flow through one or more of the plurality of contacts 118, 128 and vias 114, 124.

As an example, the channel width of a 20 V, 3 A power transistor with a gate length of 1 micrometers (μm, micron) may exceed 100 millimeters (mm). A power transistor with a 100 mm wide channel may not fit onto a conventional silicon die, which may have dimensions of 2 mm×2 mm. As a result, IC design engineers may subdivide a single power transistor into a plurality of "transistor stripes" coupled to each other in parallel. Transistor stripes may also be referred to as "fingers." Individual transistor stripes have channel widths that are relatively smaller than the total desired effective channel width of the power transistor; however, the sum of the individual channel widths of the plurality of transistor stripes may equal the total desired effective channel width of the power transistor.

Figure 2A:
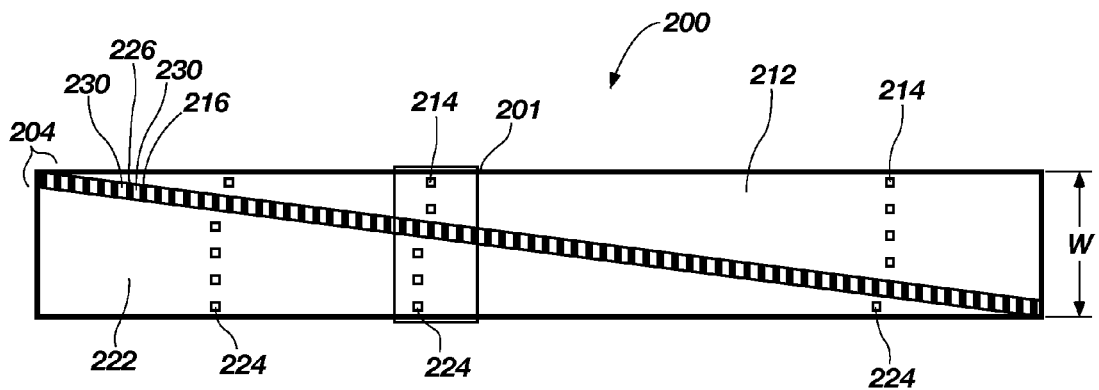
FIGS. 2A-2C illustrate a top view of a power transistor that includes a plurality of transistor stripes.
Figure 2B:
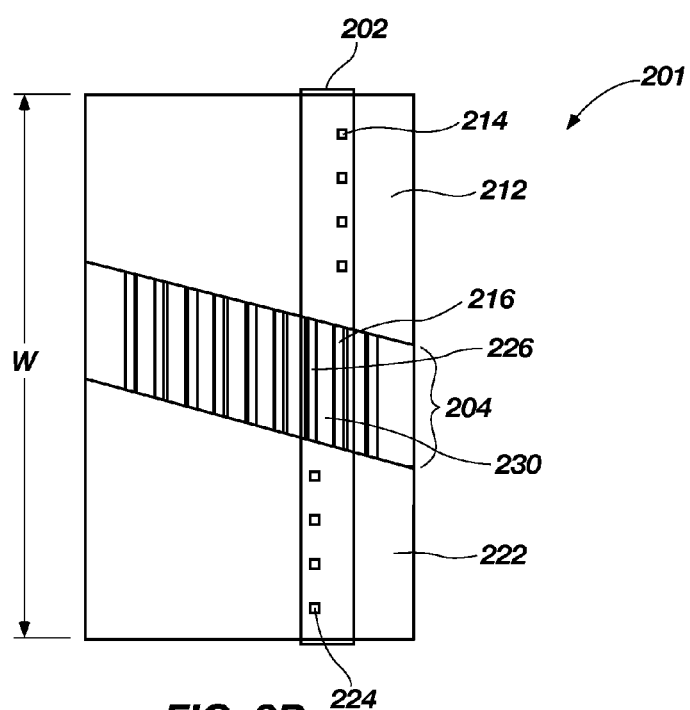
Figure 2C:
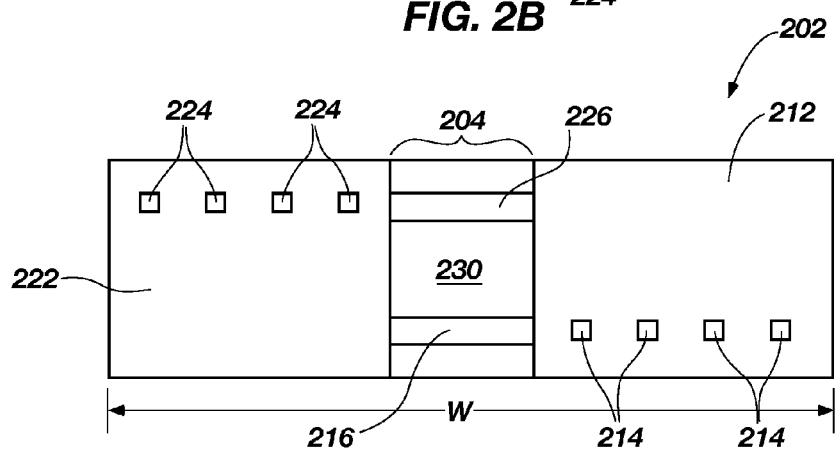

FIGS. 2A-2C illustrate a top view of a power transistor 200 that includes a plurality of transistor stripes. For example, FIG. 2A is a top view of a plurality (i.e., "block") of transistor stripes interconnected by top metal, for example, top drain metal 212, and top source metal 222. FIG. 2B is a zoomed-in, enlarged view of box 201 for the power transistor 200 of FIG. 2A to show a view of a portion of the plurality of transistor stripes. FIG. 2C is a zoomed-in, enlarged view of box 202 of FIG. 2B to show a view of an individual transistor stripe of the plurality of transistor stripes. It is noted that the individual transistor stripe shown in FIG. 2C is rotated 90 degrees from the orientation of the box 202 of FIG. 2B.

Referring collectively to FIGS. 2A-2C, the top drain metal 212 and top source metal 222 may be separated from each other by a gap 204, which is shown to be diagonally in FIGS. 2A and 2B. The individual transistor stripes may further be seen within gap 204, in that a channel 230, a bottom drain metal 216, and a bottom source metal 226 may be visible in these top views. Each of the plurality of transistor stripes may be generally configured as the power transistor 100 of FIG. 1 that is repeated and electrically coupled in a parallel block.

Thus, each transistor stripe may include diffusion regions that are coupled to metal layers through contacts and vias 214, 224, but which diffusion regions may not be visible in FIGS. 2A-2C as being located beneath top drain metal 212 and top source metal 222. Of course, while the bottom drain metal 216 and the bottom source metal 226 are shown in FIGS. 2A-2C to be adjacent the channel 230, the channel 230 may be a level below the bottom metal as shown in the 3D view of FIG. 1.

Each of the plurality of transistor stripes of FIG. 2A may have channel widths ("w") that, when summed together, may equal the total desired effective channel width of the power transistor 200. As a result, some IC design engineers may refer to such a "block" of transistor stripes of FIG. 2A as a "unit cell." Because single transistor stripes are densely packed side-by-side in the parallel structure of a power transistor block, the bottom drain metal 216 and the bottom source metal 226 are generally narrow rectangular sheets of metal interconnect coupled to the diffusion regions that alternate with the plurality of channels that form the plurality of transistor stripes.

Figure 3:
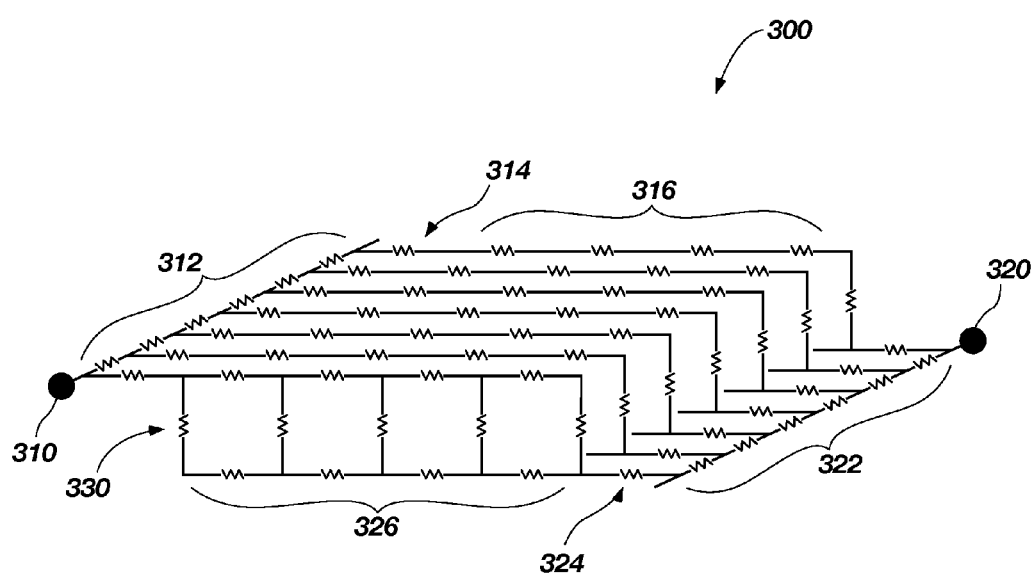
FIG. 3 is a schematic diagram of a power transistor including a plurality of transistor stripes.

FIG. 3 is a schematic diagram of a power transistor 300 including a plurality of transistor stripes, as discussed with respect to FIG. 2A. The schematic diagram of the power transistor 300 shows the electrical connections and layers of the power transistor 300 being represented by a convoluted collection of serial-and parallel-interconnected resistances between a drain terminal 310 and a source terminal 320. For example, a first row of resistors 312 may represent the top drain metal, and a second row of resistors 322 may represent the top source metal. Between each of the top drain metal and the top source metal are a plurality of transistor stripes, associated vias, and bottom metal, which are represented by resistors 314, 316, 330, 326, 324. Each of the transistor stripes may be coupled to the top drain metal to bottom drain metal through one or more vias (represented by resistors 314). The bottom drain metal for each of the transistor stripes is represented by resistors 316, which is the parasitic resistance along the bottom drain metal. Resistors 330 represent the resistance of the contacts, diffusion regions, and the channel for each of the plurality of transistor stripes. Resistors 326 represent the parasitic resistance of the bottom source metal, and resistors 324 represent one or more vias that couple the bottom source metal and the bottom drain metal.

In addition to the complexity of the configuration of resistances, the top source metal, the top drain metal, the bottom source metal, and the bottom drain metal may have different parasitic resistivities that may depend on the different materials used and/or the different shapes thereof. As a result, an aspect ratio for the plurality of transistor stripes may not likely be square for a target resistance of the plurality of transistor stripes, which may further contribute to the complexity of analyzing and properly designing the power transistor 300 for a circuit.

Figure 4:
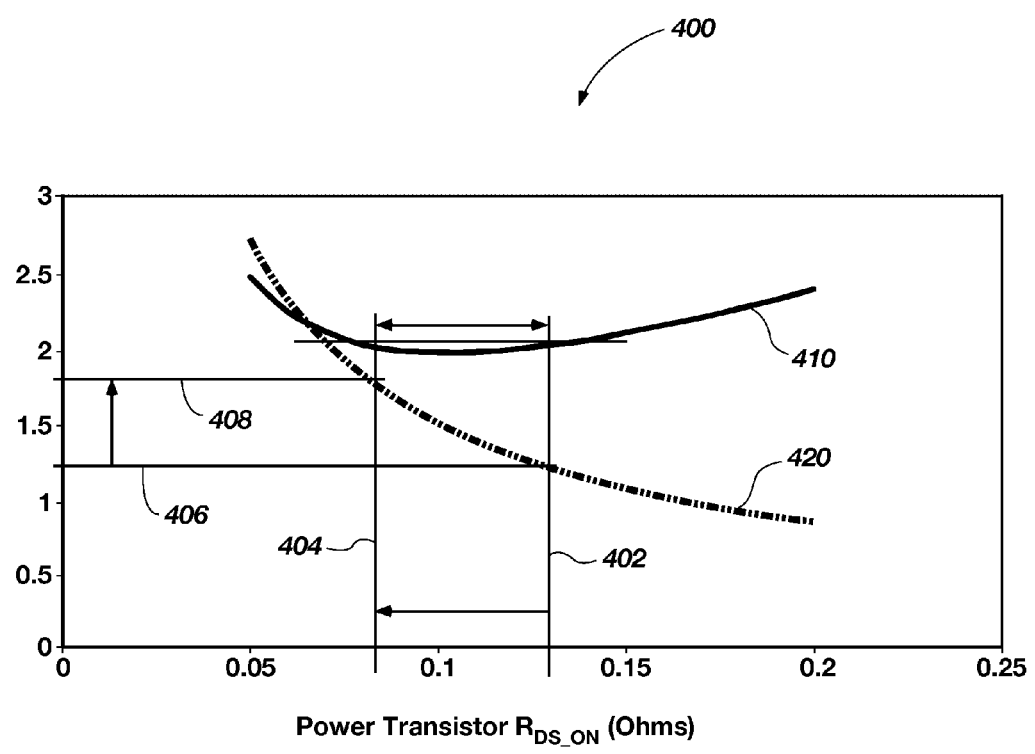
FIG. 4 is a graph illustrating the silicon area and power dissipation being plotted as functions of the on-resistance for the power transistor.

Because of the complexity in analyzing the block resistance for the transistor stripes of the power transistor, IC design engineers generally rely on one of three methods to minimize the silicon die area of the power transistor at a target drain-to-source on-resistance ("on-resistance"). As an example of the relationship between the silicon die area and the on-resistance, FIG. 4 is a graph 400 illustrating the silicon area 420 and power dissipation 410 being plotted as functions of the on-resistance for the power transistor. The on-resistance ($R_{DS\_ON}$) for the power transistor is represented by the x-axis of the graph 400. The y-axis represents watts as is related to the power dissipation 410 of the power transistor. The y-axis further represents area (e.g., mm$^2$) as is related to the silicon area 420 of the power transistor. As the on-resistance decreases (moving from right to left on the graph 400), the silicon area 420 of the power transistor increases. In addition, if the on-resistance decreases, the static power dissipation of the power transistor decreases; however, the dynamic power dissipation of the power transistor also increases because of the larger gate area for the increased silicon area 420 of the power transistor. For some on-resistances (e.g., to the right of line 402), the static power dissipation of the power transistor dominates. For other on-resistances (e.g., to the left of line 404), the dynamic power dissipation increases faster than the static power dissipation decreases, and the dynamic power dissipation may dominate for the power transistor. Between lines 406 and 408, the silicon area 420 may increase without a significant effect on the power dissipation 410 of the power transistor. However, increasing the silicon area 420 beyond line 406 may result in an undesirable increase in the power dissipation 410. Thus, even though an IC design engineer may over-size a power transistor, the power transistor may result in an overall increase in power dissipation 410.

Recognizing the complexity of analyzing the on-resistance of the power transistor (FIG. 3) and the relationships shown in FIG. 4, a first method of design often relied on by IC design engineers is simple trial and error in designing the power transistor, where the experience of the IC design engineer guides the design. Trial and error can clearly be costly because masks and first silicon may be costly to manufacture, resulting in relatively high research and development costs. Because of the costs associated with research and development, if the first silicon works, the layout of the first silicon generally goes to production even if the power transistor could have been designed with more desirable on-resistance and power dissipation characteristics.

Another method of design often relied on by IC design engineers is employing computer design tools for parasitic resistance extraction. Such computer design tools may be capable of extracting metal interconnect and other parasitic resistances. First, a designer draws a circuit schematic (e.g., a buck converter with a power transistor operating as a power switch) for the power transistor, and then simulates the circuit with a computer simulation tool (e.g., spice). If the IC design engineer is satisfied with the simulated electrical performance of the circuit, the IC design engineer draws a layout of the power transistor to specify the physical construction of each electrical device. This process may take considerable amount of time, such as weeks.

Most transistors, resistors, and other electrical device layouts are pre-drawn as programmable cells ("p-cells") for convenience, in order to quickly be placed in the layout drawing. Power transistors, however, generally are hand drawn for each project due to the size and complexity of the power transistor, which may take days or weeks of layout time. Therefore, only after that considerable effort is parasitic extraction through computer simulation even possible. Just as with simple trial and error, the huge investment in the device under examination consumes so much schedule time that only failing devices are re-worked, and over-designed devices are typically "signed off" In addition, an extracted power transistor circuit network can be relatively large (e.g., greater than 100K nets) and will often not converge. As a result of these limitations, like with trial and error, computer simulation often results in a power transistor design that is over-designed.

Another method of design uses finite element analysis, an advanced numerical computational method, to solve for the on-resistance. Like with the computer simulation method of design, the power transistor layout must already be drawn, with considerable time and cost already expended. As a result, any design that meets a minimally acceptable on-resistance goes to production on the first working design, resulting in a device that is often over-designed.

In summary, the current methods for design of the power transistor only give quality feedback to the IC design engineer at the end of the design and layout phase, such that any changes to the design would increase research and development cost and design time. As a result, IC design engineers generally over-design the silicon area of the power transistor. Because of the complexity, analytical difficulty, and design schedule pressures, integrated circuit power FETs may be over-designed resulting in excess silicon area and reduced manufacturing profits.

A method for determining a layout topology of a power transistor is disclosed. The method employs relationships described herein related to the top metal resistance, bottom metal resistance, and channel resistance, such that a layout topology of a power transistor may be created that is based at least in part using a resistance for one block of transistor stripes may be compared with another resistance for another block of transistor stripes in order to determine a quantity and width of transistor stripes for a layout topology of the power transistor, the quantity and width of transistor stripes for the layout topology being determined based on comparison of the resistance and the another resistance. The quantity and width of the transistor stripes may result in a silicon area and layout that is more closely related to an acceptable on-resistance.

Referring again briefly to FIG. 2A, the total effective power transistor gate width is approximately the sum of the individual widths of the plurality of transistor stripes. The plurality of transistor stripes may be referred to as a "block" of transistor stripes, or a "unit cell" of the power transistor. If grouped as a single block (i.e., group), the area of the block of transistor stripes is approximately the same regardless of the number of transistor stripes because the area of the block of transistor stripes is a function of the total transistor width (i.e., the number of transistor stripes*width). Because the area of a rectangular block=w×h, a decrease in the number of transistor stripes results in a decrease in top metal height and an increase in bottom metal width. In addition, an increase in the number of transistor stripes results in an increase in top metal height and a decrease in bottom metal width.

As is shown in FIG. 3, a power transistor block is essentially a complex network of series and parallel connected resistor elements. An equivalent circuit may be used to simplify the analysis to include three serially connected elements. For example, the equivalent resistance ($R_{EQ}$) for a block of transistor stripes may be:

$$R_{EQ} = R_{Drain} + R_{Channel} + R_{Source} \quad \text{Eq. (1)}.$$

$R_{EQ}$ is the equivalent value of the resistance of the power transistor as if a single resistor were present that dissipates the same power as the more complicated configuration of the power transistor.

Figure 5A:
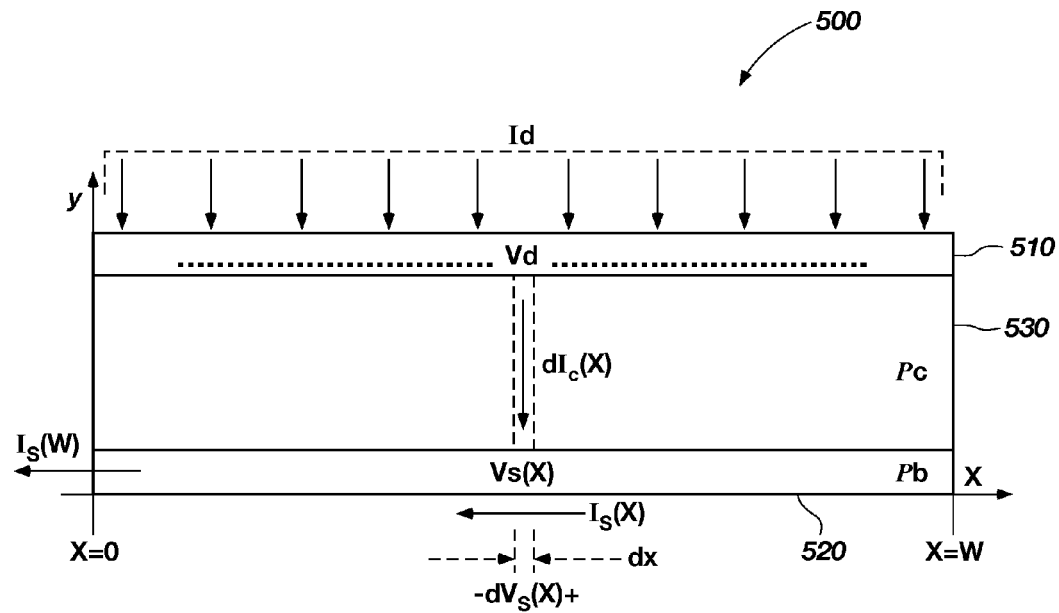
FIG. 5A is a simplified top view of a power transistor according to an embodiment of the present invention.

FIG. 5A is a simplified top view of a power transistor 500 according to an embodiment of the present invention. The power transistor may include a drain 510 with bottom metal connection, a source 520 with bottom metal connection, and a channel 530 therebetween. For this example, the drain 510 is simplified to be a single metal that is intended to represent the bottom drain metal, and the source 520 is simplified to be a single metal that is intended to represent the bottom source metal. FIG. 5A shows the orientation of the drain 510, source 520, and channel 530 and the direction of current flow in the X-Y plane. The top metal (not shown) associated with the source and the drain would be oriented in the Z plane, which would be located "out of the page" of FIG. 5A. The channel 530 is shown as a single area; however, the channel 530 may be subdivided into a plurality of channels, such that the power transistor 500 comprises a plurality of transistor stripes as described herein.

Figure 5B:
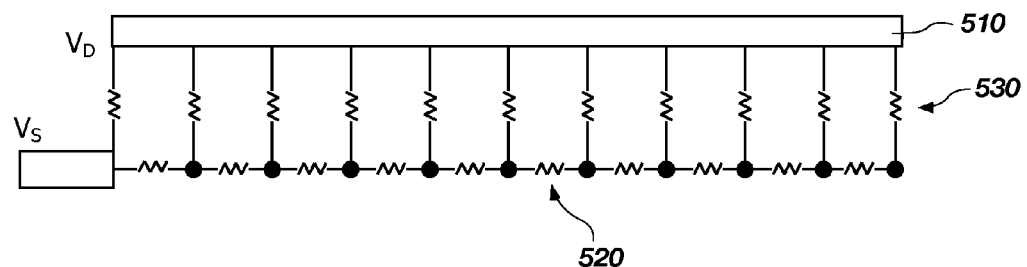
FIG. 5B is an equivalent schematic drawing of the power transistor of FIG. 5B.

Although simple in appearance, identifying the equivalent resistance ($R_{EQ}$) for each of these areas may prove difficult. For example, FIG. 5B is an equivalent schematic drawing of the power transistor 500 of FIG. 5A. The channel 530 is represented by a plurality of incremental resistors in the vertical direction. Because the current flows along the bottom source metal, the parasitic resistance within the source 520 may be represented by showing distributed incremental resistances in the horizontal direction along the length of the source 520.

Figure 6A:
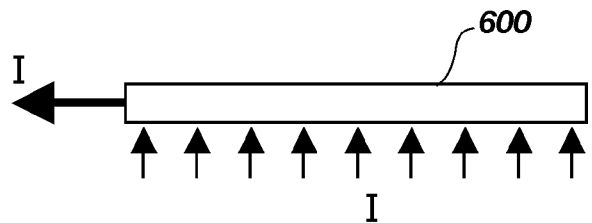
FIGS. 6A-6C illustrate different shapes of top metal according to an embodiment of the present invention.
Figure 6B:
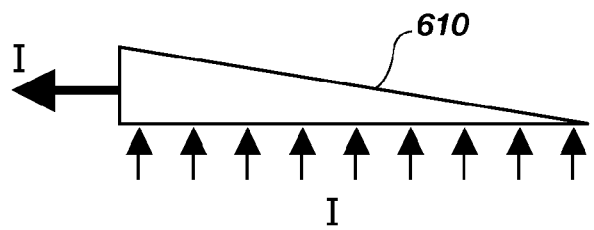
Figure 6C:
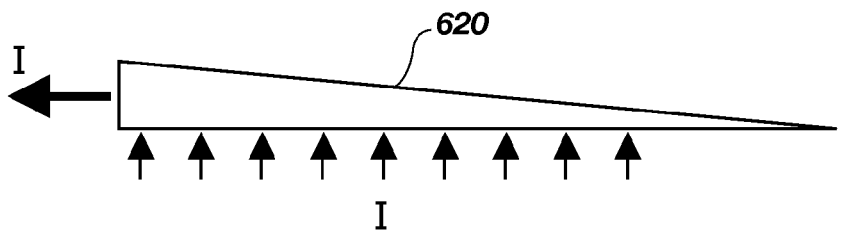

Referring again to FIG. 5A, the drain current Id going into the power transistor 500 is equal to the source current $I_S(W)$, at position X=0, going out of the power transistor 500. The channel current $dI_c(X)$ is the incremental current through one of the transistor stripes. The source current $I_S(X)$ at a position "X" along the length of the source 520 flows toward the output termal of the source 520 and is the integral of the incremental channel current $dI_c(X)$. In other words, the source 520 sums the incremental channel current $dI_c(X)$. For example, for an individual transistor stripe, the bottom source metal sums the incremental current, and the total current in the bottom source metal is increasing as a function of position from right to left of FIG. 5A. For a plurality of transistor stripes, the top source metal sums the incremental current from each of the individual transistor stripes, and the total current in the top source metal also may increase as a function of position. In either scenario, the voltage drop in a rectangular metal sheet may be parabolic rather than linear. In addition, the current density on the left side of a rectantular sheet of metal will be higher than on the right side, assuming the orientation of FIG. 5A. The existence of an increase in the current density in the top source metal often causes IC design engineers to replace a rectangular-shaped top metal 600 with different shapes such as a wedge-shaped top metal 610 or a trapezoid-shaped top metal 620, as shown in FIGS. 6A-6C.

Referring again to FIG. 5A, the following relationships also exist for the power transistor 500 of FIG. 5A: $V_D=V_D(0)=V_D(x)=V_D(w); V_S=V_S(x);\quad V_C=V_D-V_S;\quad P_S=P_S(x); dV_S=dV_S(x); I_S=I_S(x); dI=dI(x); \text{ and } dP_S=dP_S(x)$. Setting up the differential equation:

$$dI_C = \frac{(V_D - V_S)}{p_C} dx, \quad \text{Eq. (2)}$$

results in the following relationships:

$$V_S = V_D\left(1 - \frac{e^{ax} + e^{a(2w-x)}}{e^{2aw} + 1}\right); \quad \text{Eq. (3)}$$

$$V_C = V_D\left(\frac{e^{ax} + e^{a(2w-x)}}{e^{2aw} + 1}\right); \quad \text{Eq. (4)}$$

$$I_S = \left(\frac{V_D}{ap_c}\right)\left(\frac{e^{a(2w-x)} - e^{ax}}{e^{2aw} + 1}\right); \quad \text{Eq. (5)}$$

$$I_S(x=0) = \left(\frac{V_D}{ap_c}\right)\left(\frac{e^{2aw} - 1}{e^{2aw} + 1}\right); \quad \text{Eq. (6)}$$

$$R_C = \frac{ap_c}{2}\left(\frac{e^{2aw}(e^{2aw} + 4aw) - 1}{(e^{2aw} - 1)^2}\right); \quad \text{Eq. (7)}$$

$$R_S = \frac{ap_c}{2}\left(\frac{e^{2aw}(e^{2aw} - 4aw) - 1}{(e^{2aw} - 1)^2}\right); \quad \text{Eq. (8)}$$

$$R_{EQ} = R_S + R_C = ap_c\left(\frac{e^{2aw} + 1}{e^{2aw} - 1}\right); \quad \text{Eq. (9)}$$

$$Power_{Source} = \frac{V_D^2(e^{2aw}(e^{2aw} - 4aw) - 1)}{2ap_c(1 + e^{2aw})^2}; \quad \text{Eq. (10)}$$

and $$Power_{Channel} = \frac{V_D^2(e^{2aw}(e^{2aw} + 4aw) - 1)}{2ap_c(1 + e^{2aw})^2}, \quad \text{Eq. (11)}$$

where $$a = \sqrt{\frac{p_m}{p_c}},$$

$p_m$=metal ohms/um; $p_c$=channel ohms/um; and w=transistor width. The resistance values $R_C$, $R_S$, and $R_{EQ}$, are power-equivalent resistances that dissipates the same amount of power as the corresponding portion of the distributed resistor network (FIG. 3) with a sheet of input current and a single output current. For example, the channel resistance $R_C$ is a power-equivalent resistance of the channel, the source metal resistance $R_S$ is a power-equivalent resistance of the source metal, and the total equivalent resistance $R_{EQ}$ is the power-equivalent resistance of the power transistor.

Using equations (3) through (11), a relationship between the top metal, the bottom metal, the channel resistance, and the equivalent on-resistance for the power transistor can be quickly found that enables a desirable on-resistance*silicon area configuration. For example, the equations (3) through (11) may be used to determine relationships of either the top metal or the bottom metal. For example, while considering the summation of the current of a single transistor channel, $p_c$ may refer to the channel resistivity, and $p_m$ may refer to the bottom metal resistivity. While considering the summation of the current of a plurality of transistor stripes of a block of transistors, $p_c$ may refer to the effective resistivity of a single transistor stripe multiplied by the drain-to-source pitch, and $p_m$ may refer to the top metal resistivity. In addition, equations (3) through (11) may enable the comparison of different metal layout topologies prior to design layout, such that the conventional approaches of trial and error, computer simulation, parasitic resistance extraction, or advanced numerical computational methods may not be necessary. Therefore, timely and accurate comparisons may be made between different power transistor constructions. As a result, a more desirable IC layout topology may be designed in the first instance, which may reduce design time, design costs, and manufacturing costs by reducing over-designing the power transistors.

Figure 7:
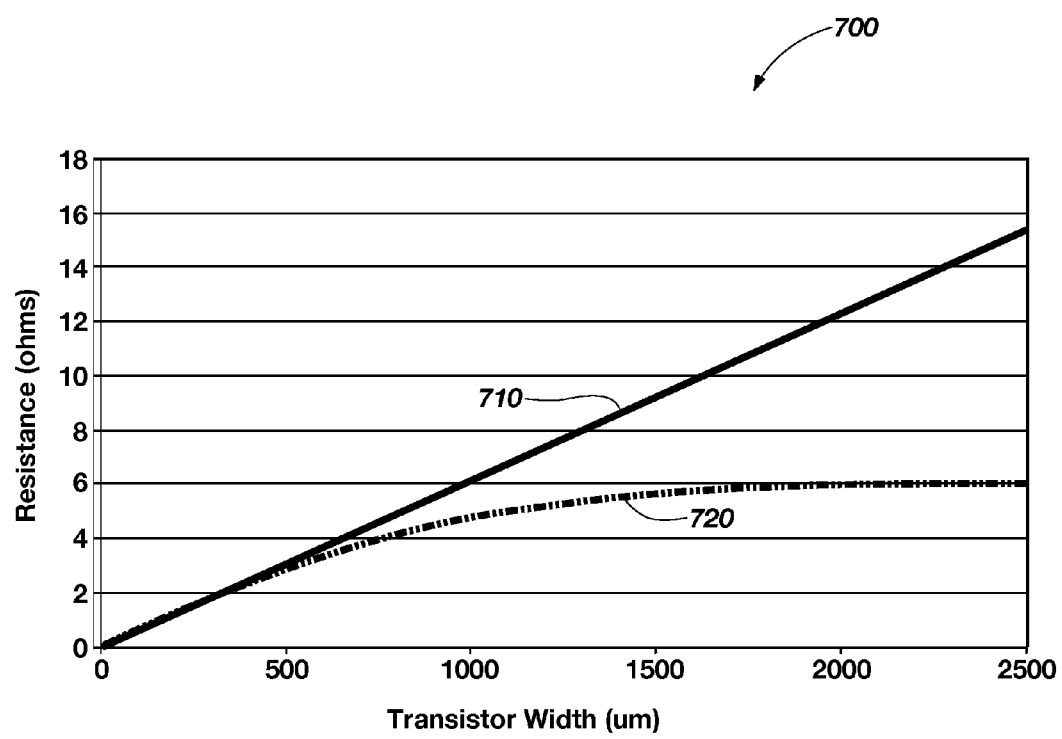
FIG. 7 is a graph illustrating the on-resistance of a power transistor as the channel widths increase for the plurality of transistor stripes.

As a further example of a benefit from using embodiments of the present invention to guide the design of a power transistor, FIG. 7 is a graph 700 illustrating the on-resistance of the top metal of a power transistor as the individual channel width increases for the individual transistor stripes of the plurality. For example, line 710 is an expected on-resistance associated with the top metal according to conventional wisdom related to an IC layout design of a power transistor while increasing the widths of the plurality of transistor stripes, and line 720 is an estimated on-resistance associated with the top metal while increasing the widths of the plurality of transistor stripes, as determined at least in part on one or more of the equations previously discussed. Increasing the widths of the plurality of transistor stripes may imply that a total number of transistor stripes in the plurality are reduced accordingly such that the overall effective channel width of the power transistor remains the same. In other words, as the transistor width of the individual transistor stripes increases as shown in FIG. 7, the total number of transistor stripes may be lower.

A voltage loss in the top metal may cause a decrease in the channel voltage of the power transistor, which may result in a decrease in channel current for a fixed terminal drain to source voltage. A decrease in the channel current is an effective increase in on-resistance for the power transistor, which may result in a loss in the performance of the power transistor. As illustrated by line 710, conventional wisdom may expect the on-resistance of the top metal to increase approximately linearly with respect to an increase in the channel width of the transistor stripes. The estimated on-resistance of the top metal, determined by one or more of the equations above, however, shows that the on-resistance of the top metal may not increase linearly as expected. Instead, as the width of the transistor stripes is increased, an asymptote may be reached.

In addition to the on-resistance of the top metal increasing, the on-resistance associated with the channel decreases. The on-resistance associated with the channel also may not be a linear function of the channel widths of the individual transistor stripes, and corresponding number of transistor stripes. For example, increasing the channel width of the transistor stripes (and correspondingly decreasing the number of transistor stripes) may cause the source voltage to become larger, which results in a smaller channel voltage. As the individual transistor stripes are made wider, more current flows in bottom metal, which may result in an even greater loss of channel voltage. The smaller channel voltage results in less than expected channel current, and equivalently, greater than expected channel on-resistance. As a result, parasitic power dissipation may approach zero, and the actual top metal on-resistance and channel on-resistance may no longer contribute to the power transistor's equivalent on-resistance. In other words, a point of diminishing return may be reached for the on-resistance of the power transistor, and once that point is reached, increasing the width of the transistor stripes may no longer improve the on-resistance of the power transistor. As a result, increasing the width of the transistor stripes may merely increase the silicon area and the parasitic gate charge (i.e., $CV^2f$ power dissipation loss) of the power transistor without achieving improvement in static on-resistance of the power transistor.

Figure 8:
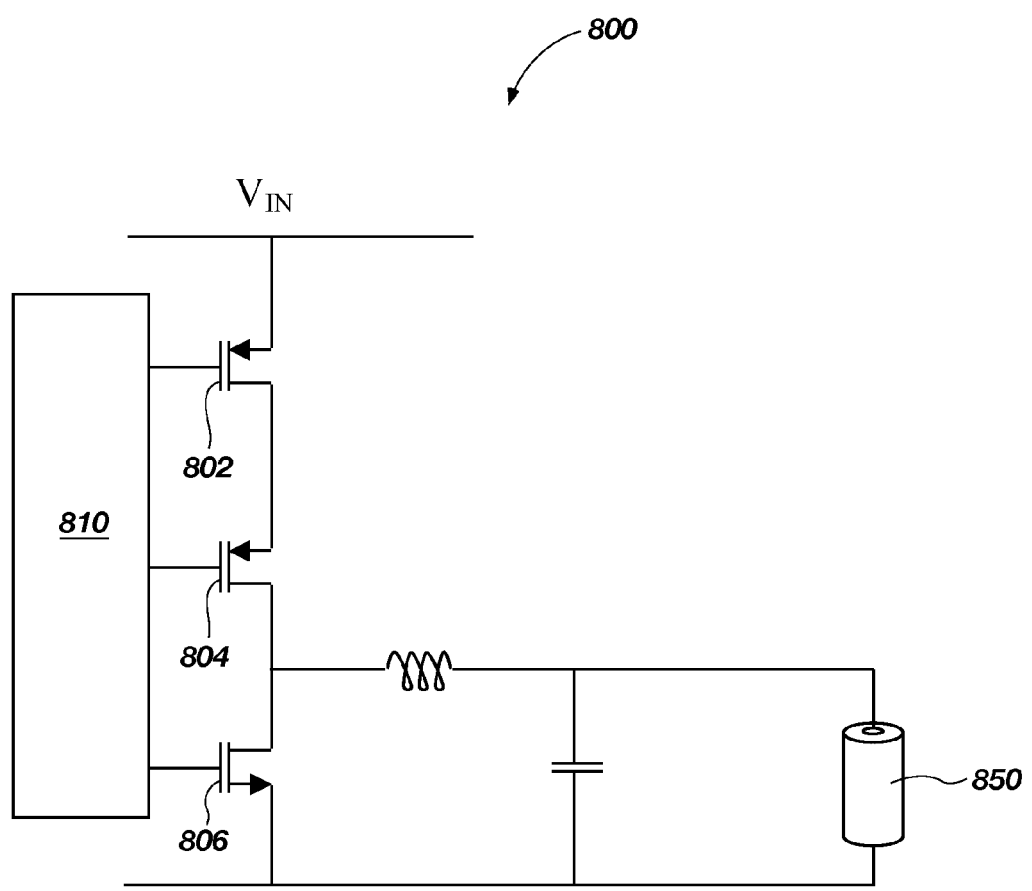
FIG. 8 illustrates an example of a switching power converter.

Switching power circuits often use a plurality of power switches (e.g., power FETs) to deliver a modulated input voltage waveform to an energy storage device, such as an inductor. For example, FIG. 8 illustrates an example of a switching power converter 800. In this example, the switching power converter 800 may be a charger for a power storage device (e.g., battery) 850.

The switching power converter 800 includes a plurality of power transistors 802, 804, 806 coupled to each other in series. For example, the switching power converter 800 includes a high side power transistor 804, a low side power transistor 806, and a high side reverse current blocking power transistor 802. The high side power transistor 804 and the low side power transistor 806 are configured to dynamically switch the expected buck current for the high side and low side of the switching power converter 800, while the high side reverse current blocking power transistor 802 is configured to provide a static, high-side reverse current blocking for those cases where an output voltage of the power storage device 850 exceeds an input voltage $V_{IN}$ to the switching power converter 800. The switching power converter 800 receives power from an input voltage $V_{IN}$, and generates an output voltage in response thereto. The operation of the switching power converter 800 may be performed by a driver 810 coupled to each of the gates of the plurality of power transistors 802, 804, 806.

While the switching power converter 800 shown in FIG. 8 is configured as a buck converter, embodiments of the present invention may include other power converters such as boost converters, LDOs, and other similar configurations that include power transistors. Modifications to the switching power converter 800 may be made for such other types of power converters, as will be readily apparent by those skilled in the art.

Figure 9:
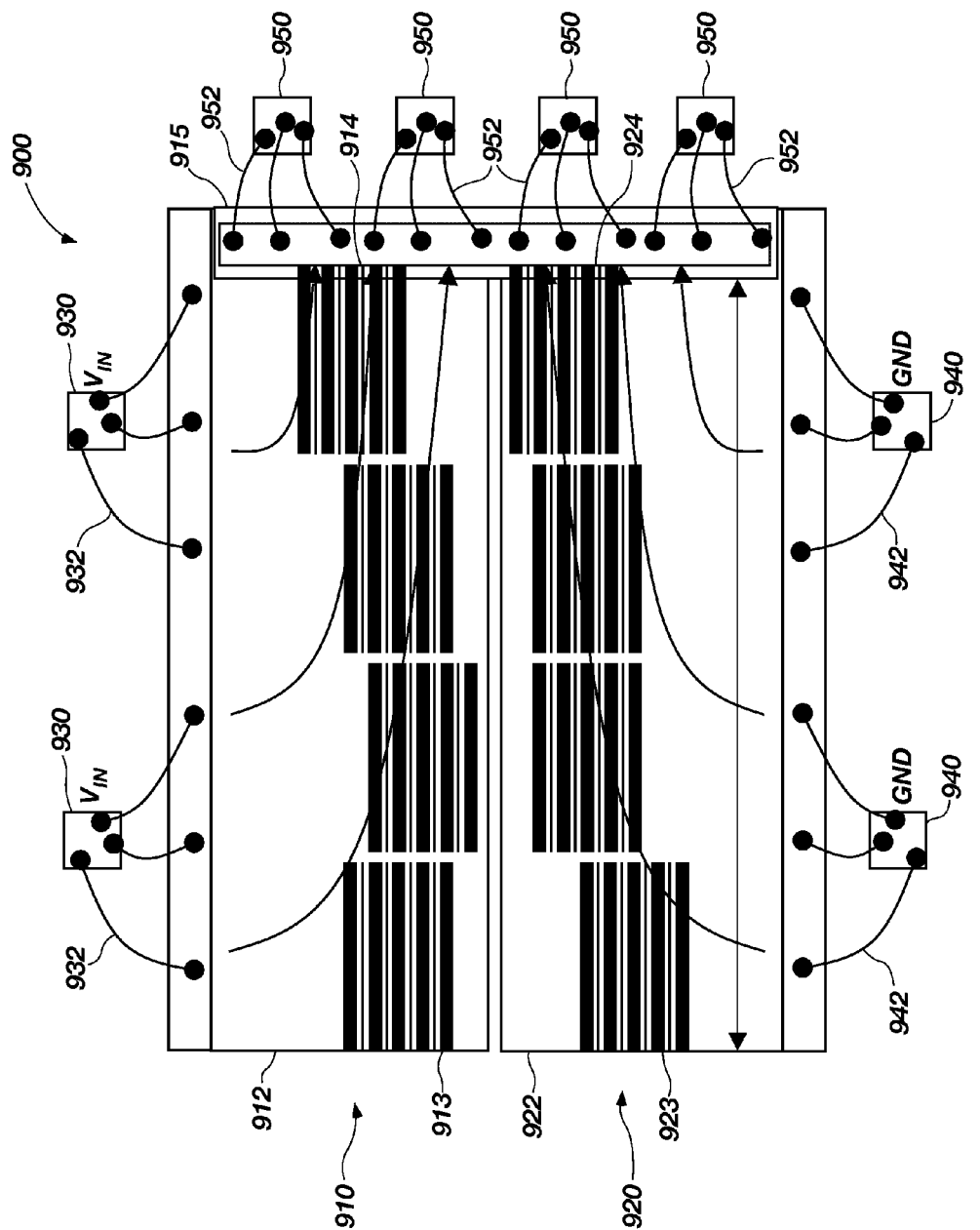
FIG. 9 illustrates an IC layout topology of a plurality of power transistors.

FIG. 9 illustrates an IC layout topology 900 of a plurality of power transistors 910, 920. For example, a first power transistor 910 may be a high side power transistor, and a second power transistor 920 may be a low side power transistor of a power converter (see, e.g., FIG. 8). As shown in FIG. 9, the first power transistor 910 and the second power transistor 920 may be coupled between a voltage input ($V_{IN}$) and a supply return, often called ground (GND). The first power transistor 910 and the second power transistor 920 may further be serially coupled at a common node.

The first power transistor 910 may include a first top metal 912 associated with one of a source and a drain, and a second top metal 915 associated with the other of the source and the drain. For example, the first top metal 912 may be the top source metal, and the second top metal 915 may be the top drain metal for the first power transistor 910. The first power transistor 910 further includes a plurality of transistor stripes. The plurality of transistor stripes include a plurality of alternating channels and diffusion regions coupled to the first top metal 912 and the second top metal 915 coupled through first bottom metal and second bottom metal, as previously described. The plurality of first bottom metal, second bottom metal, and channels for the first power transistor 910 are represented by the parallel horizontal lines that extend from the left side of the first top metal 912 to the right side of the first top metal 912, and through to the left side of the second top metal 915. The parallel horizontal lines alternate between the first bottom metal, the channels, and the second bottom metal. In order to enough provide space to clearly provide numerical designations of the various components, it is noted that not all of the parallel horizontal lines may be shown in FIG. 9 (as well as those in FIGS. 10 and 11). Generally, the plurality of transistor stripes are located below most, if not all, of the top metal, and not necessarily in the offset manner depicted in the drawings herein.

As shown in FIG. 9, the plurality of transistor stripes for the first power transistor 910 are organized as a single group of transistor stripes that have the same channel width (w). In other words, the single group of transistor stripes is a single continuous block of channels below the first top metal 912 and the second top metal 915. In addition, each of the plurality of channels have a channel width (w) that is approximately equal to the width of first top metal 912. As a result, the single group of transistor stripes includes channels that have a first end 913 that is located on a left side of the first top metal 912, and a second end 914 that is located on a left side of the second top metal 915.

The plurality of transistor stripes have individual channel widths (w) that, due to the parallel electrical connection, combine to have an effective channel width of the first power transistor 910, as previously described. For example, to achieve an effective channel width of 100 mm, 100 transistor stripes each with a width (w) of 1,000 um may be used. An equivalent configuration may include 1,000 transistor stripes, each with a width (w) of 100 um, and so on.

The second power transistor 920 may include a first top metal 922 and a second top metal 915. For example, the first top metal 922 may be the top source metal, and the second top metal 915 may be the top drain metal for the second power transistor 920. The second power transistor 920 further includes a plurality of transistor stripes. The plurality of transistor stripes include a plurality of alternating channels and diffusion regions coupled to the first top metal 922 and the second top metal 915 coupled through first bottom metal and second bottom metal, as previously described. The plurality of first bottom metal, second bottom metal, and channels for the second power transistor 920 are represented by the parallel horizontal lines that extend from the left side of the first top metal 922 to the right side of the first top metal 922, and through to the left side of the second top metal 915.

Like with the first power transistor 910, the plurality of transistor stripes of the second power transistor 920 have individual channel widths (w) that combine to have an effective channel width of the second power transistor 920. In addition, the plurality of transistor stripes for the second power transistor 920 are organized as a single group of transistor stripes that have the same channel width (w). In other words, the single group of transistor stripes is a single continuous block of channels below the first top metal 922 and the second top metal 915. In addition, each of the plurality of transistor stripes of the second power transistor 920 have a channel width (w) that is approximately equal to the width of first top metal 922. As a result, the single group of transistor stripes includes channels that have a first end 923 that is located on a first side of the first top metal 922, and a second end 924 that is located on a first side of the second top metal 915.

Although not specifically shown in FIG. 9, but as previously described, the plurality of transistor stripes, first bottom metal, and second bottom metal for the first power transistor 910 may be coupled to the first top metal 912 and the second top metal 915 through a plurality of vias and contacts. Likewise, the plurality of transistor stripes, first bottom metal, and second bottom metal for the second power transistor 920 may be coupled to the first top metal 922 and the second top metal 915 through a plurality of vias and contacts.

The nodes of the first power transistor 910 and the second power transistor 920 may be wire bonded to bond pads and package pins. For example, bond wires 932 couple the first top metal 912 of the first power transistor 910 to the $V_{IN}$ bond pads 930, bond wires 942 couple the first top metal 922 of the second power transistor 920 to the GND bond pads 940, and bond wires 952 couple the shared second top metal 915 to the output bond pads 950. The bond wires 932, 942, 952 may contribute additional parasitic resistance to the overall resistance of the plurality of power transistors 910, 920.

It is noted that the second top metal 915 is described as being associated with the first power transistor 910 and the second power transistor 920 because of the common node between the first power transistor 910 and the second power transistor 920. As a result, the second top metal 915 may be shared between the first power transistor 910 and the second power transistor. Locating the second top metal 915 on the end of the plurality of channels proximate the output bond pads 950 reduces the length of the bond wires 952. Reducing the length of the bond wires 952 may reduce the resistance that the bond wires 952 contribute to the overall circuit.

As previously discussed, the on-resistance of the plurality of power transistors 910, 920 may suffer at least for two reasons. One factor contributing to a relatively large on-resistance is that for some channel widths of the individual transistor stripes, the effective channel resistance associated with the bottom metal may be increased. Another factor contributing to the relatively large on-resistance is that the bond wires 952 related to the first power transistor 910 (i.e., the top two sets of bond wires 952) do not have a relatively low conductance path to the bond wires 952 related to the second power transistor 920 (i.e., the bottom two sets of bond wires 952). Likewise, the bond wires 952 related to the second power transistor 920 (i.e., the bottom two sets of bond wires 952) do not have a relatively low conductance path to the bond wires 952 related to the first power transistor 910 (i.e., the top two sets of bond wires 952). As a result, the bond wire resistance may be higher than would be the case if a relatively lower conductance path between the two did exist.

Figure 10:
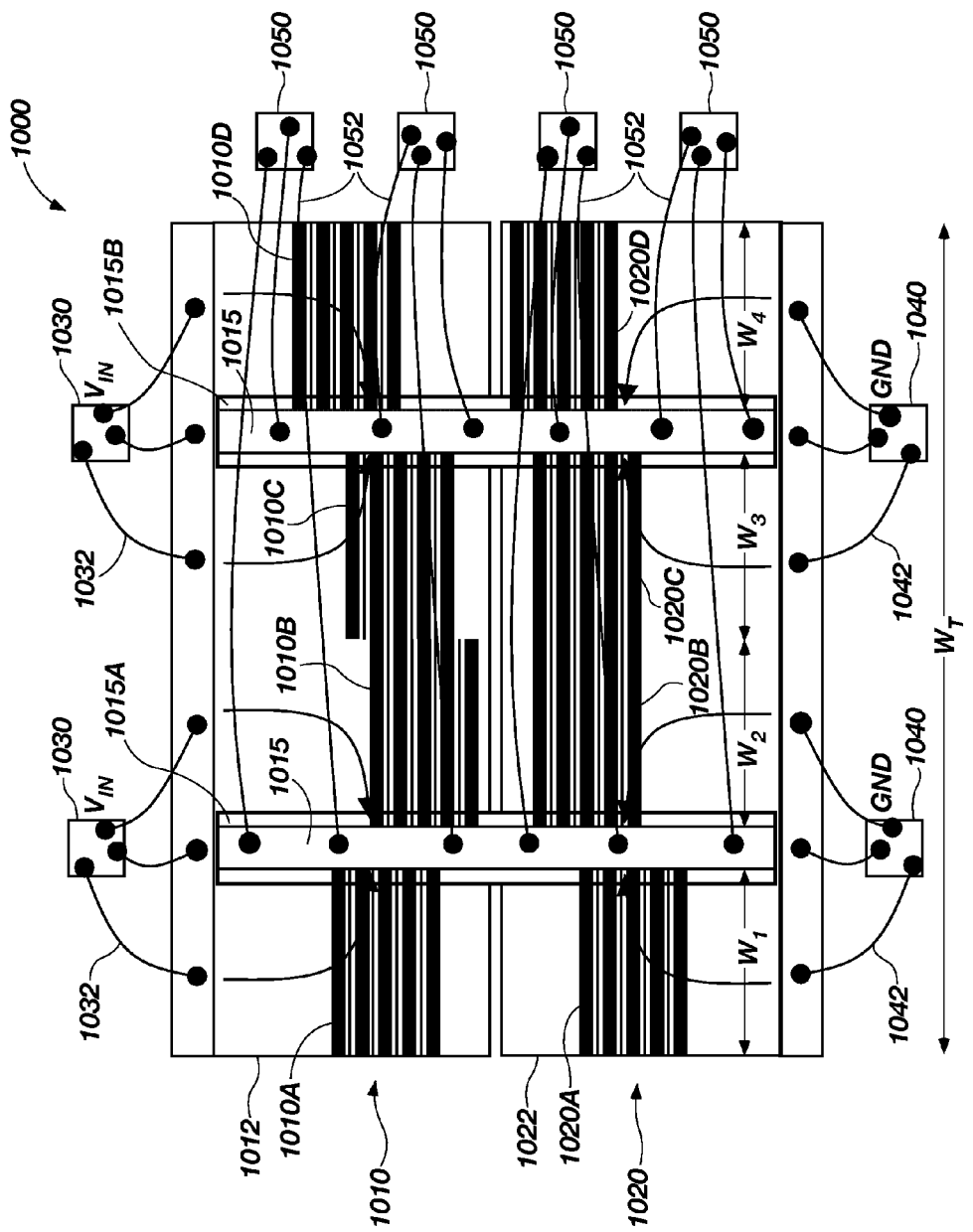
FIG. 10 illustrates an IC layout topology of a plurality of power transistors according to an embodiment of the present invention.

FIG. 10 illustrates an IC layout topology 1000 of a plurality of power transistors 1010, 1020 according to an embodiment of the present invention. For example, a first power transistor 1010 may be a high side power transistor, and the second power transistor 1020 may be a low side power transistor of a power converter. The first power transistor 1010 and the second power transistor 1020 may be coupled between a voltage input ($V_{IN}$) and a supply return, often called ground (GND). The first power transistor 1010 and the second power transistor 1020 may further be serially coupled at a common node.

The first power transistor 1010 and the second power transistor 1020 may each include a drain, a source, and a channel therebetween. The first power transistor 1010 may include a first top metal 1012, and the second power transistor 1020 may include a first top metal 1022. For embodiments in which the first power transistor 1010 and the second power transistor 1020 are serially coupled at a common node, the first power transistor 1010 and the second power transistor 1020 may share a second top metal 1015. It is noted that the second top metal 1015 includes at least two discrete portions 1015A, 1015B, which will be described more fully below.

For the first power transistor 1010, the first top metal 1012 may be associated with one of the source and the drain of the first power transistor 1010, and the second top metal 1015 may be associated with the other of the source and the drain of the first power transistor 1010. Likewise, for the second power transistor 1020, a first top metal 1022 may be associated with one of the source and the drain of the second power transistor 1020, and the second top metal 1015 may be associated with the other of the source and the drain of the second power transistor 1020. For example, the first top metal 1012 may be the top source metal, and the second top metal 1015 may be the top drain metal for the first power transistor 1010. The first top metal 1022 may be the top source metal, and the second top metal 1015 may be the top drain metal for the second power transistor 1020.

The channel of the first power transistor 1010 is divided into smaller channels to form a plurality of transistor stripes. The plurality of transistor stripes include a plurality of alternating channels and diffusion regions coupled to the first top metal 1012 and the second top metal 1015 coupled through first bottom metal and second bottom metal, as previously described. The first bottom metal, the second bottom metal, and the channels for the first power transistor 1010 are represented by the horizontal lines such that the first bottom metal, the second bottom metal, and the channels are shown to alternate underneath the first top metal 1012.

The second power transistor 1020 also includes a plurality of transistor stripes. The plurality of transistor stripes include a plurality of alternating channels and diffusion regions coupled to the first top metal 1022 and the second top metal 1015 coupled through first bottom metal and second bottom metal, as previously described. The first bottom metal, the second bottom metal, and the channels for the second power transistor 1020 are represented by the horizontal lines such that the first bottom metal, the second bottom metal, and the channels are shown to alternate underneath the first top metal 1022.

Although not specifically shown in FIG. 10, but as previously described, the plurality of transistor stripes, first bottom metal, and second bottom metal for the first power transistor 1010 may be coupled to the first top metal 1012 and the second top metal 1014 through a plurality of vias and contacts. Likewise, the alternating plurality of transistor stripes, first bottom metal, and second bottom metal for the second power transistor 1020 may be coupled to the first top metal 1022 and the second top metal 1015 through a plurality of vias and contacts.

The plurality of transistor stripes of the first power transistor 1010 are grouped in a plurality of different groups 1010A-1010D of transistor stripes. The second top metal 1015 includes a plurality of portions 1015A, 1015B that separate the groups 1010A-1010D of transistor stripes from each other. For example, a first group 1010A of transistor stripes is separated from a second group 1010B of transistor stripes by the first portion 1015A of the second top metal 1015. A third group 1010C of transistor stripes is separated from a fourth group 1010D of transistor stripes by the second portion 1015B of the second top metal 1015. As a result, at least two different groups (e.g., groups 1010A, 1010B) of transistor stripes are positioned on opposing sides of a portion (e.g., discrete portion 1015A) of a second top metal of the power transistor 1010, and at least one portion (e.g., portion 1015A) of the second top metal 1015 is coupled to different groups (e.g., groups 1010A, 1010B) of transistor stripes.

The plurality of transistor stripes of each of the first power transistor 1010 have individual channel widths that combine to have an effective channel width for the first power transistor 1010. In addition, the plurality of transistor stripes for the first power transistor 1010 are organized as a plurality of groups 1010A-1010D, wherein the transistor stripes within an individual group have the same channel width. For example, the first group 1010A of transistor stripes 1010A may have a channel width ($W_1$), the second group 1010B of transistor stripes may have a channel width ($W_2$), the third group 1010C of transistor stripes may have a channel width ($W_3$), and the fourth group 1010D of transistor stripes may have a channel width ($W_4$).

The channel widths ($W_1$, $W_2$, $W_3$, $W_4$) are less than the overall total width ($W_T$) of the first power transistor 1010. In addition, the sum of the channel widths (i.e., $W_1+W_2+W_3+W_4$) may be approximately equal to the overall total width ($W_T$) of the first power transistor 1010. For example, if the channel widths ($W_1$, $W_2$, $W_3$, $W_4$) of the individual groups of transistor stripes are each 250 um, the overall total width ($W_T$) for the first power transistor 910 may be approximately 1000 um. Of course, the overall total width ($W_T$) may be somewhat greater than 1000 um depending on the spacing of the gap between the first top metal 1012 and the second top metal 1015, as well as due to the width of the second top metal 1015 itself. The sum of the channel widths ($W_1+W_2+W_3+W_4$) multiplied by the number (i.e., quantity) of transistor stripes is approximately the overall effective channel width of the first power transistor 1010.

While the individual groups of transistor stripes are described as having equal channel widths, the individual groups of transistor stripes may have channel widths that are not equal to each other. In addition, the second group 1010B of transistor stripes and the third group 1010C of transistor stripes are shown as positioned between the first portion 1015A and the second portion 1015B of the second top metal 1015. As a result, the second group 1010B of transistor stripes and the third group 1010C of transistor stripes may be continuous with each other, or in other words, may essentially be one group of transistor stripes with a combined channel width ($W_2+W_3$). In operation, the current nearer the first portion 1015A of the second top metal 1015 may tend to flow to thereto, and the current nearer the second portion 1015B of the second top metal 1015 may tend to flow thereto such that the second group 1010B of transistor stripes and the third group 1010C of transistor stripes are effectively separate. In some embodiments, there may be some physical separation between the second group 1010B of transistor stripes and the third group 1010C of transistor stripes.

While this discussion related to the groups 1010A, 1010B, 1010C, 1010D and their respective channel widths ($W_1$, $W_2$, $W_3$, $W_4$) of the individual groups of transistor stripes specifically addresses the first power transistor 1010, the discussion above also relates to the individual groups 1020A, 1020B, 1020C, 1020D of transistor stripes of the second power transistor 1020.

The nodes of the first power transistor 1010 and the second power transistor 1020 may be wire bonded to bond pads and package pins. For example, bond wires 1032 couple the first top metal 1012 of the first power transistor 1010 to the $V_{IN}$ bond pads 1030, bond wires 1042 couple the first top metal 1022 of the second power transistor 1020 to the GND bond pads 1040, and bond wires 1052 couple the shared second top metal 1015 to the output bond pads 1050. The bond wires 1032, 1042, 1052 may contribute additional parasitic resistance to the overall resistance of the plurality of power transistors 1010, 1020.

In contrast with the second top metal 915 of FIG. 9, the second top metal 1015 of FIG. 10 may be laterally spaced away from the output bond pads 1050. In other words, there may be at least one group (e.g., fourth group 1010D) of transistor stripes and a corresponding portion of the first top metal 1012 laterally positioned between at least a portion (e.g., second portion 1015B) the second top metal 1015 and the output bond pads 1050. It is noted that the first portion 1015A of the second top metal 1015 is also laterally spaced away from the output bond pads 1050 such that the second group 1010B, the third group 1010C, and the fourth group 1010B of transistor stripes are laterally positioned therebetween. In other words, the second top metal 1015 may be distributed throughout the first top metal 1012.

As previously discussed, the first portion 1015A and the second portion 1015B are discrete portions of the second top metal 1015. While FIG. 10 shows two portions 1015A, 1015B of the second top metal 1015 that are positioned at locations within the first top metal 1012, other numbers of portions of the second top metal 1015 may be employed. In some embodiments, the second top metal 1015 may include a single portion that is located approximately in the middle of the first top metal 1012, which may result in subdividing groups of transistor stripes that are approximately one half of the total overall width ($W_T$) of the first power transistor 1010. In some embodiments, the second top metal 1015 may include three or more portions of second top metal distributed throughout the first top metal 1012 to further subdivide groups of transistor stripes into groups of smaller channel widths. In some embodiments, a portion of the second top metal 1015 may be located proximate the output bond pads 1050 while other portions of the second top metal 1015 may be distributed and located within the first top metal 1012.

Those of ordinary skill in the art may quickly identify the greater lengths of the bond wires 1052, which results in an increase in the resistance contributed by the bond wires 1052. As a result, there may be some configurations in which there may be no net improvement in the on-resistance of the first power transistor 1010 more than offsets the increase in bond wire 1052 resistance. Because of the complexity of analysis and conventional methods for design described above, experienced IC design engineers may not be able to reliably determine whether or not there is an improvement in the on-resistance of the power transistor until after considerable cost and time has been expended.

As an example of calculating the difference in the overall on-resistance of the IC topology layout 1000 of FIG. 10 and the IC layout topology 900 of FIG. 9, the added bond wire resistances are easily calculated. For this example, the following typical parameters are assumed: the bond wires 1052 are 1.3 mil gold bond wires with a corresponding resisitivity of 25.7 mΩ/mm; the distance between the die edge and the package bonding post is 0.25 mm; the distance between the die edge to IC bond pad spacing is 0.05 mm; the dimensions of each of the first power transistor 1010 and the second power transistor 1020 is 750 um×1000 um; and the metal and channel resitivities are those from a commonly available CMOS foundry processes. Different transistor types and different foundry metallization systems may have different resistivities for the metal and channel.

With the above assumptions, the six bond wires 952 associated with the first power transistor 910 of FIG. 9 are 0.3 mm long, whereas three of the bond wires 1052 associated with the first power transistor 1010 of FIG. 10 are 0.55 mm long, and the other three bond wires 1052 associated with the first power transistor 1010 are 1.05 mm long. As a result, the resistance for the six bond wires 952 associated with the first power transistor 910 of FIG. 9 is approximately 1.29 mΩ, whereas the resistance for the six bond wires 1052 associated with the first power transistor 1010 of FIG. 10 is approximately 3.09 mΩ. As a result, the added length to the bond wires 1052 may increase the resistance attributable to the bond wires 1052 by approximately 1.8 mΩ.

The resistance associated with the plurality of transistor stripes for the first power transistor 910 of FIG. 9 is 72.2 mΩ as estimated by the relationships of one or more of equations (3) through (11). The resistance associated with the plurality of transistor stripes for the first power transistor 1010 of FIG. 10 is 51.5 mΩ, a as estimated by the relationships of one or more of equations (3) through (11). Adding the resistance associated with the bond wires 952, 1052 to the respective first power transistors 910, 1010, the overall combined resistance of the first power transistor 910 is approximately 73.5 mΩ and the overall combined resistance of the first power transistor 1010 is approximately 54.6 mΩ. As a result, the IC layout design 1000 of FIG. 10 may exhibit approximately a 25% reduction of on-resistance over the IC layout topology 900 of FIG. 9, even considering the additional increase in resistance from the longer bond wires 1052.

Figure 11:
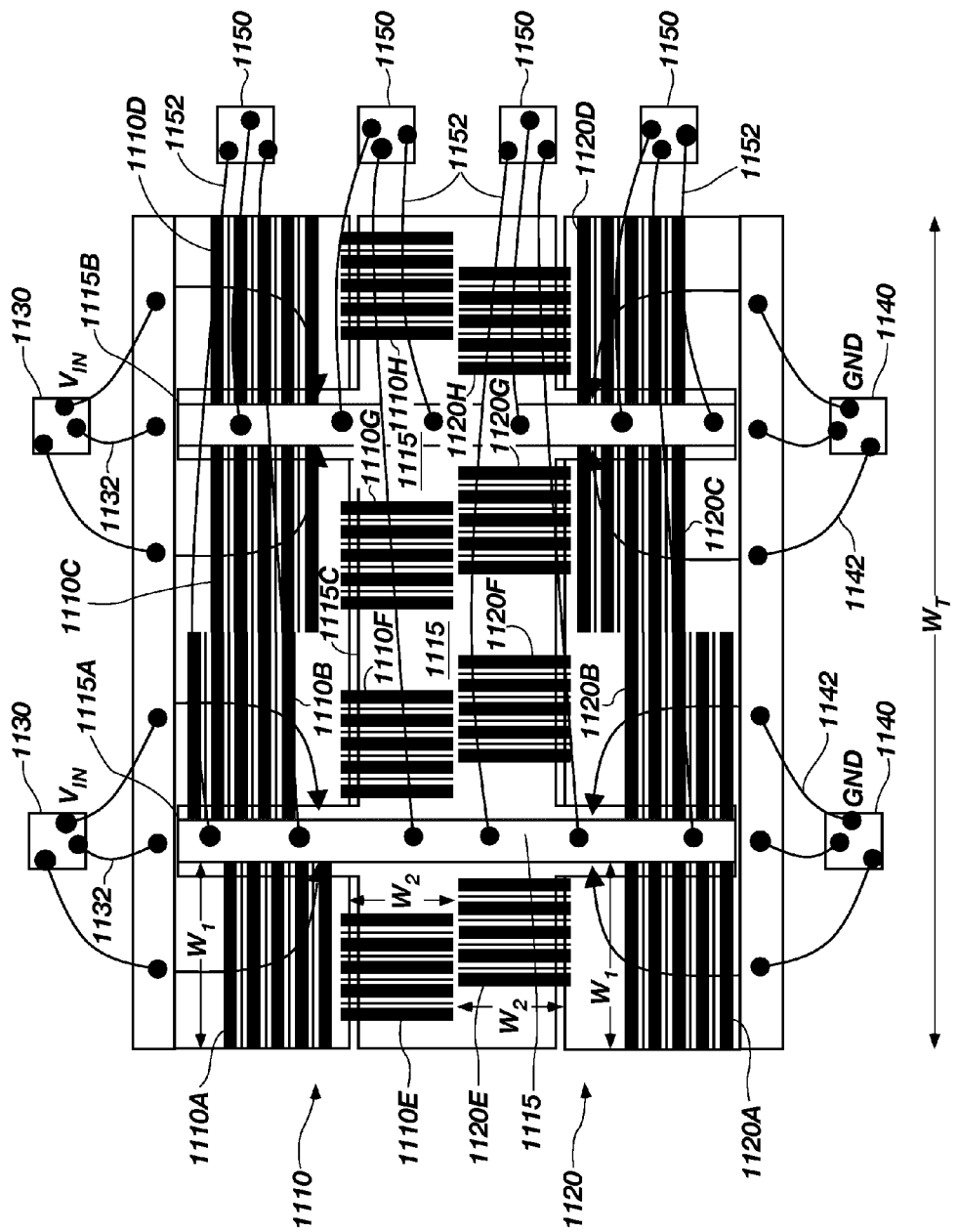
FIG. 11 illustrates an IC layout topology of a plurality of power transistors according to another embodiment of the present invention.

FIG. 11 illustrates an IC layout topology 1100 of a plurality of power transistors 1110, 1120 according to another embodiment of the present invention. For example, a first power transistor 1110 may be a high side power transistor, and the second power transistor 1120 may be a low side power transistor of a power converter. The first power transistor 1110 and the second power transistor 1120 may be coupled between a voltage input ($V_{IN}$) and a supply return, often called ground (GND). The first power transistor 1110 and the second power transistor 1120 may further be serially coupled at a common node.

The first power transistor 1110 and the second power transistor 1120 may each include a drain, a source, and a channel therebetween. The first power transistor 1110 may include a first top metal 1112, and the second power transistor 1120 may include a first top metal 1122. For embodiments in which the first power transistor 1110 and the second power transistor 1120 are serially coupled as a common node, the first power transistor 1110 and the second power transistor 1120 may share a second top metal 1115.

For the first power transistor 1110, the first top metal 1112 may be associated with one of the source and the drain of the first power transistor 1110, and the second top metal 1115 may be associated with the other of the source and the drain of the first power transistor 1110. Likewise, for the second power transistor 1120, the first top metal 1122 may be associated with one of the source and the drain of the second power transistor 1120, and the second top metal 1115 may be associated with the other of the source and the drain of the second power transistor 1120. For example, the first top metal 1112 may be the top source metal, and the second top metal 1115 may be the top drain metal for the first power transistor 1110. The first top metal 1122 may be the top source metal, and the second top metal 1115 may be the top drain metal for the second power transistor 1120.

As with previous examples, the channels of the first power transistor 1110 and the second power transistor 1120 are subdivided into smaller channels to form a plurality of transistor stripes. The first power transistor 1110 includes a plurality of transistor stripes. The plurality of transistor stripes include a plurality of alternating channels and diffusion regions coupled to the first top metal 1112 and the second top metal 1115 coupled through first bottom metal and second bottom metal, as previously described. The plurality of transistor stripes for the first power transistor 1110 are represented by the groups of vertical and horizontal lines underneath the first top metal 1112.

The second power transistor 1120 also includes a plurality of transistor stripes. The plurality of transistor stripes include a plurality of alternating channels and diffusion regions coupled to the first top metal 1122 and the second top metal 1115 coupled through first bottom metal and second bottom metal, as previously described. The plurality of transistor stripes for the second power transistor 1120 are represented by the groups of vertical and horizontal lines underneath the first top metal 1122.

Although not specifically shown in FIG. 11, but as previously described, the plurality of transistor stripes, first bottom metal, and second bottom metal for the first power transistor 1110 may be coupled to the first top metal 1112 and the second top metal 1114 through a plurality of vias and contacts. Likewise, the plurality of transistor stripes, first bottom metal, and second bottom metal for the second power transistor 1120 may be coupled to the first top metal 1122 and the second top metal 1115 through a plurality of vias and contacts.

The plurality of transistor stripes of the first power transistor 1110 are grouped in a plurality of different groups 1110A-1110D of transistor stripes. The second top metal 1115 includes a plurality of portions that separate the groups 1110A-1010D of transistor stripes from each other. For example, a first group 1110A of transistor stripes is separated from a second group 1110B of transistor stripes by the first portion 1115A of the second top metal 1115. A third group 1110C of transistor stripes is separated from a second group 1110D of transistor stripes by the second portion 1115B of the second top metal 1115.

At least some of the groups of transistor stripes are in a rotated position at an angle (e.g., 90 degrees) relative to one or more other groups of transistor stripes. For example, groups 1110E, 1110F, 1110G, 1110H of transistor stripes are rotated in relative to groups 1110A, 1110B, 1110C, 1110D. Although rotating some of the groups of transistor stripes may result in groups of transistor stripes that are not physically parallel, the groups of transistor stripes of the first power transistor 1110 may nevertheless be electrically parallel, in that the electrical connections may be in parallel such that each of the groups 1110A, 1110B, 1110C, 1110D and the rotated groups 1110E, 1110F, 1110G, 1110H contribute to the effective channel width of the first power transistor 1110.

By rotating at least some of the parallel transistor stripes at the tip of the first top metal 1112 and at the tip of the first top metal 1122, the second top metal 1115 may be expanded in comparison with that of FIG. 10 without an increase in the resistance of the active area of the plurality of transistor stripes. For example, the second top metal 1115 may further include at least one additional portion 1115C continuous with the first portion 1115A of the second metal 1115. The at least one additional portion 1115C may be coupled to at least one group (e.g., groups 1110F, 1110G) of transistor stripes that is in the rotated position. The at least one additional portion 1115C may be continuous with the second portion 1115B of the second metal 1115 such that the first portion 1115A and the second portion 1115B are likewise continuous. In other words, the second top metal 1115 may include a continuous piece that includes a first portion 1115A, a second portion 1115B, and a third portion (e.g., additional portion 1115C) of the second top metal 1115. The first portion 1115A couples with a first group (e.g., group 1110A) of the plurality of channels from a first direction. The second portion 1115B couples with a second group (e.g., group 1110D) of the plurality of channels from a second direction. The additional portion 1115C couples with a third group (e.g., 1110F) of the plurality of channels from a third direction. As the first portion 1115A couples with two groups (e.g., groups 1110A, 1110B) from opposing sides and from different directions, the first portion 1115A itself may also be considered a first portion coupled with a first group from a first direction and a second portion coupled with a second group from a second direction. As a result, a second metal 1115 that is cross shaped with a single vertical piece and a single horizontal piece is contemplated as an embodiment of the present invention. The second metal 1115 may further include one or more vertical pieces, one or more horizontal pieces (or shapes in other directions), or combinations thereof.

As with other embodiments, the plurality of transistor stripes of each of the first power transistor 1110 have individual channel widths that combine to have an effective channel width for the first power transistor 1110. In addition, the transistor stripes within an individual group may have the same channel width. For example, a first group 1110A of transistor stripes 1110A may have a channel width ($W_1$), another group 1110E of transistor stripes may have a channel width ($W_2$), and so on. The channel widths ($W_1$, $W_2$, etc.) are less than the overall total width ($W_T$) of the first power transistor 1110. In addition, the sum of the channel widths may be approximately equal to the overall total width ($W_T$) of the first power transistor 1110. While the individual groups of transistor stripes may have equal channel widths, the individual groups of transistor stripes may have channel widths that are not equal to each other.

While this discussion related to the groups 1110A, 1110B, 1110C, 1110D and rotated groups 1110E, 1110F, 1110G, 1110H of transistor stripes and their respective channel widths specifically addresses the first power transistor 1110, the discussion also relates to the individual groups 1120A, 1120B, 1120C, 1120D and rotated groups 1110E, 1110F, 1110G, 1110H of transistor stripes of the second power transistor 1120.

The nodes of the first power transistor 1110 and the second power transistor 1120 may be wire bonded to bond pads and package pins. For example, bond wires 1132 couple the first top metal 1112 of the first power transistor 1110 to $V_{IN}$ bond pads 1130, bond wires 1142 couple the first top metal 1122 of the second power transistor 1120 to the GND bond pads 1140, and bond wires 1152 couple the shared second top metal 1115 to output bond pads 1150. The bond wires 1132, 1142, 1152 may contribute additional parasitic resistance to the overall resistance of the plurality of power transistors 1110, 1120.

With the second top metal 1115 being continuous and widened between the first power transistor 1010 and the second power transistor 1020, a conduction path may be opened for the bond wires 1152 such that some of the current from the first power transistor 1110 can additionally flow through some of the bond wires 1152 associated with the second power transistor 1120. In addition, some of the current from the second power transistor 1120 can additionally flow through some of the bond wires 1152 associated with the first power transistor 1110. As a result, the IC layout topology 1100 for the plurality of power transistors 1110, 1120 may further reduce the parasitic on-resistance contributed by the bond wires 1152.

Using the previous assumptions for the analysis of FIG. 10, the resistance contributed by the ten bond wires 1052 of FIG. 11 may be approximately 1.86 mΩ. As a result, the overall on-resistance of the IC layout topology 1100 of FIG. 11 may decrease by approximately 1 mΩ as compared to the IC layout topology 1000 of FIG. 10. While an improvement of approximately 1 mΩ in the parasitic on-resistance may seem small, power transistors with total pin-to-pin on-resistance of about 10 mΩ may be common for high current and very high efficiency switching converters. In such a case, 1 mΩ of additional parasitic resistance represents a 10% decrease in pin-to-pin resistance. In order to achieve the same 10% decrease in pin-to-pin resistance, conventional approaches may lead an IC design engineer to increase the silicon area of the power transistor by 10% in order to offset the additional bond wire resistance. Increasing the silicon area of the power transistor may result in higher manufacturing cost, as well as in a greater power dissipation due to the increased dynamic ($CV^2f$) power loss caused by a corresponding increase in the gate area.

Figure 12A:
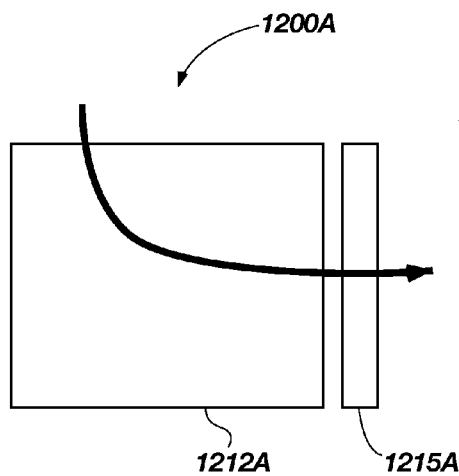
FIGS. 12A-12D are simplified top views of power transistors according to various embodiments of the present invention.
Figure 12B:
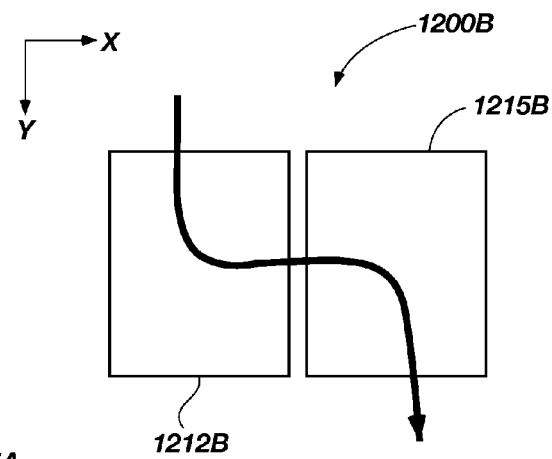
Figure 12C:
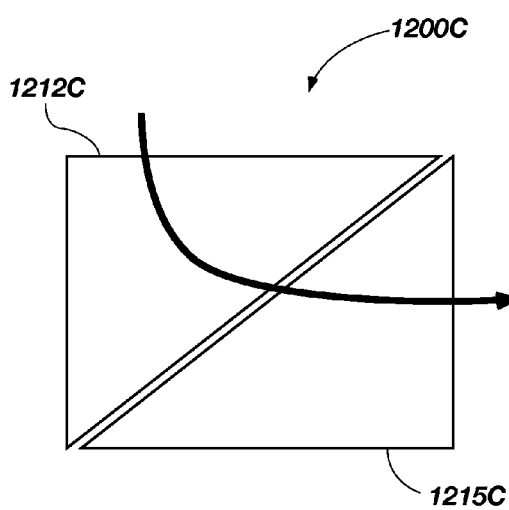
Figure 12D:
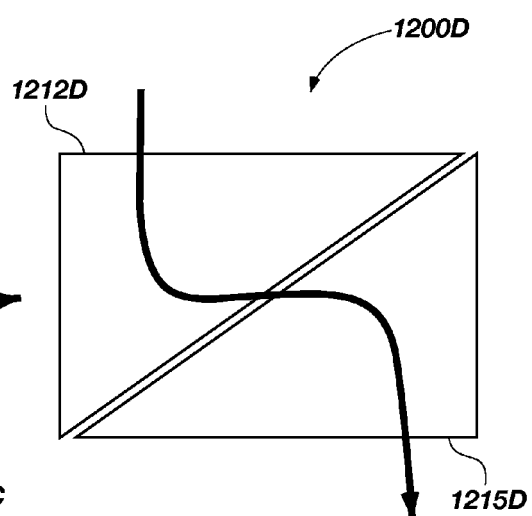

FIGS. 9-11 illustrate configurations of power transistors that include rectangular top metal with the current to flowing through the power transistor in the X and Y directions. Other shapes and configurations are also contemplated. For example, FIGS. 12A-12D are simplified top views of power transistors 1200A-1200D according to various embodiment of the present invention. The power transistor 1200A of FIG. 12A is similar to FIGS. 9-11 in that a first top metal 1212A and a second top metal 1215A are configured for the current to flow into the first top metal 1212A in the Y direction, and out of the second top metal 1215A in the X direction. Other configurations may also be employed. For example, the power transistor 1200B of FIG. 12B includes first top metal 1212B and second top metal 1215B that are rectangular shaped, and that are configured for the current to flow into the first top metal 1212A in the Y direction, and out of the second top metal 1215B in the Y direction. The power transistor 1200C of FIG. 12C and the power transistor 1200D of FIG. 12D are wedge shaped. The power transistor 1200C is configured for current to flow into the first top metal 1212C in the Y direction, and out of the second top metal 1215C in the X direction. The power transistor 1200D is configured for current to flow into the first top metal 1212D in the Y direction, and out of the second top metal 1215D in the Y direction. The direction of current flow in the top metal may depend on the placement and configuration of bond pads and bond wires. Of course, other combinations are contemplated including flowing into the first metal in the X direction, as well as employing top metal that are other shapes (e.g., trapezoidal shapes) or combinations of shapes. While not shown in FIGS. 12A-12D, the transistor stripes may be oriented such that the bottom metal may cause current to flow in one or more directions under the top metal layers (see, e.g., FIG. 11).

While the present invention has been described herein with respect to certain illustrated embodiments, those of ordinary skill in the art will recognize and appreciate that the present invention is not so limited. Rather, many additions, deletions, and modifications to the illustrated and described embodiments may be made without departing from the scope of the invention as hereinafter claimed along with their legal equivalents. In addition, features from one embodiment may be combined with features of another embodiment while still being encompassed within the scope of the invention as contemplated by the inventor.

What is claimed is:

1. An apparatus, comprising:
   a first power transistor, comprising:
      a drain, a source, and a channel therebetween divided into a plurality of transistor stripes, the plurality of transistor stripes being grouped in a plurality of different groups;
      a first top metal associated with one of the drain and the source; and
      a second top metal associated with the other of the drain and the source, wherein the second top metal includes at least one portion that is coupled to different groups of transistor stripes.

2. The apparatus of claim 1, wherein the first power transistor further comprises:
   a first bottom metal coupled to the first top metal through a plurality of vias; and
   a second bottom metal coupled to the first bottom metal through another plurality of vias, wherein the first bottom metal and the second bottom metal couple to opposing ends of each of the plurality of transistor stripes.

3. The apparatus of claim 1, wherein at least one group of transistor stripes of the plurality of transistor stripes is in a rotated position at an angle relative another group of transistor stripes of the plurality of transistor stripes.

4. The apparatus of claim 3, wherein the angle of rotation relative to the another group of transistor stripes is 90 degrees, such that the widths of the at least one group of transistor stripes that is rotated is perpendicular to the widths of the another group of transistor stripes.

5. The apparatus of claim 3, wherein the second top metal further includes at least one additional portion continuous with the at least one portion, wherein the at least one additional portion is coupled to the at least one group of transistor stripes that is in the rotated position, and the at least one portion is coupled to the another group of transistor stripes.

6. The apparatus of claim 1, wherein the second top metal includes at least two discrete portions that is separated by a portion of the first top metal.

7. The apparatus of claim 6, wherein one of the at least two discrete portions of the second top metal is positioned proximate to bond pads coupled to the second top metal through bond wires, such that the groups of transistor stripes are located on only one side of the one of the portions of the second top metal.

8. The apparatus of claim 7, wherein the first top metal and the second top metal have one of a rectangular shape, wedge shape, and a trapezoidal shape.

9. The apparatus of claim 7, wherein a quantity and width of individual transistor stripes of the plurality of transistor stripes is determined at least in part from a calculation of an effective resistances (R) of the power transistor, using an equation:

$$R = ap_c \frac{(e^{2aw} + 1)}{(e^{2aw} - 1)},$$

wherein $$a = \sqrt{\frac{p_m}{p_c}},$$

$p_m$ is a resistivity of the first top metal and second top metal, $p_c$ is a resistivity of a channel, and w is a width of a plurality of transistor stripes.

10. The apparatus of claim 1, wherein:
the plurality of transistor stripes include a plurality of channels that contribute to an overall effective channel width of the first power transistor; and
the second top metal includes at least a first portion that couples with a first group of the plurality of channels from a first direction, and at least a second portion that couples with a second group of the plurality of channels from a second direction.

11. The apparatus of claim 10, further comprising a second power transistor operably coupled in series with the first power transistor, the second power transistor comprising:
a drain, a source, and a channel therebetween, wherein the channel of the second power transistor is divided into a plurality of channels that contribute to an overall effective channel width of the second power transistor; and
a first top metal associated with one of the source and the drain of the second power transistor, wherein the second top metal is associated with the other of the source and the drain of the second power transistor.

12. The apparatus of claim 11, wherein the second top metal includes a plurality of discrete portions.

13. The apparatus of claim 12, wherein each of the plurality of discrete portions of the second top metal is positioned within an area at least partially surrounded by the first top metal.

14. The apparatus of claim 12, wherein at least one of the plurality of discrete portions is positioned at an end of the first top metal proximate a bond pad.

15. The apparatus of claim 10, wherein the first top metal of the first power transistor is coupled to at least one input bond pad through at least one bond wire therebetween.

16. The apparatus of claim 15, wherein the first top metal of the second power transistor is coupled to at least one ground bond pad through at least one bond wire therebetween.

17. The apparatus of claim 16, wherein the second top metal is coupled to at least one output bond pad through at least one bond wire therebetween.

18. The apparatus of claim 17, further comprising a plurality of output bond wires coupled between the second top metal and the at least one output bond pad, wherein at least two output bond wires of the plurality have different lengths.

19. The apparatus of claim 10, further comprising a driver operably coupled to first power transistor and the second power transistor, wherein the driver is configured to control gates of the first power transistor and the second power transistor.

20. The apparatus of claim 10, wherein the second top metal includes a continuous piece that includes the at least a first portion of the second top metal, the at least a second portion of the second top metal, and at least a third portion of the second top metal that couples with a third group of the plurality of channels from a third direction.

21. The apparatus of claim 10, wherein the third group of the plurality of channels are oriented in a rotated position relative to the first group of the plurality of channels and the second group of the plurality of channels.

22. The apparatus of claim 11, further comprising a power converter that includes a driver operably coupled with the first power transistor and the second power transistor.

23. The apparatus of claim 22, wherein the power converter is selected from the group consisting of a buck converter, a boost converter, an LDO converter.

24. The apparatus of claim 22, further comprising an integrated circuit that includes the power converter.

* * * * *